United States Patent [19]
Cahill

[11] Patent Number: 5,493,714
[45] Date of Patent: Feb. 20, 1996

[54] APPARATUS AND METHOD FOR AUTOMATICALLY CONTROLLING A REFERENCE FREQUENCY IN A DUAL MODE RECEIVER

[75] Inventor: Stephen V. Cahill, Palatine, Ill.

[73] Assignee: Motorola Inc., Schaumburg, Ill.

[21] Appl. No.: 496,492

[22] Filed: Jun. 29, 1995

Related U.S. Application Data

[63] Continuation of Ser. No. 103,004, Aug. 6, 1993, abandoned.

[51] Int. Cl.$^6$ .................................... H04B 1/16
[52] U.S. Cl. .................... 455/259; 455/75; 455/142; 455/192.2; 455/316; 375/216
[58] Field of Search .................... 455/74–76, 182.2, 455/192.1, 192.2, 195.1, 196.1, 197.2, 142, 259, 260, 262, 264, 265, 316; 375/216, 344

[56] References Cited

U.S. PATENT DOCUMENTS

| | | | |
|---|---|---|---|
| 4,817,192 | 3/1989 | Phillips et al. | 455/75 |
| 4,955,074 | 9/1990 | Omoto | 455/182.2 |
| 5,163,159 | 11/1992 | Rich et al. | 455/74 |

Primary Examiner—Reinhard J. Eisenzopf
Assistant Examiner—Chi H. Pham
Attorney, Agent, or Firm—Kevin D. Kaschke

[57] ABSTRACT

An apparatus and method for automatically controlling a reference frequency (120) in a receiver (104) that receives either analog (116) or digital (136) information signals. The receiver (18) includes a frequency translator (109) for translating a carrier frequency (137) to an intermediate frequency (118) and maintaining the intermediate frequency (118) at a desired value responsive to the reference frequency (120). A first measure of frequency error (211, 212) is detected between the reference frequency (120) and the intermediate frequency (118). A second measure of frequency error (125, 126) is detected between the reference frequency (120) and the intermediate frequency (118). A current signal (213) is produced responsive to the first measure of frequency error (211, 212) when the receiver receives the analog information signal (116) and responsive to the second measure of frequency error (125, 126) when receiver receives the digital information signal (136). A frequency control signal (130) is produced responsive to the current signal (213) to automatically control thereby the reference frequency (120) when the receiver (18) receives either analog (116) or digital (136) information signals.

14 Claims, 3 Drawing Sheets

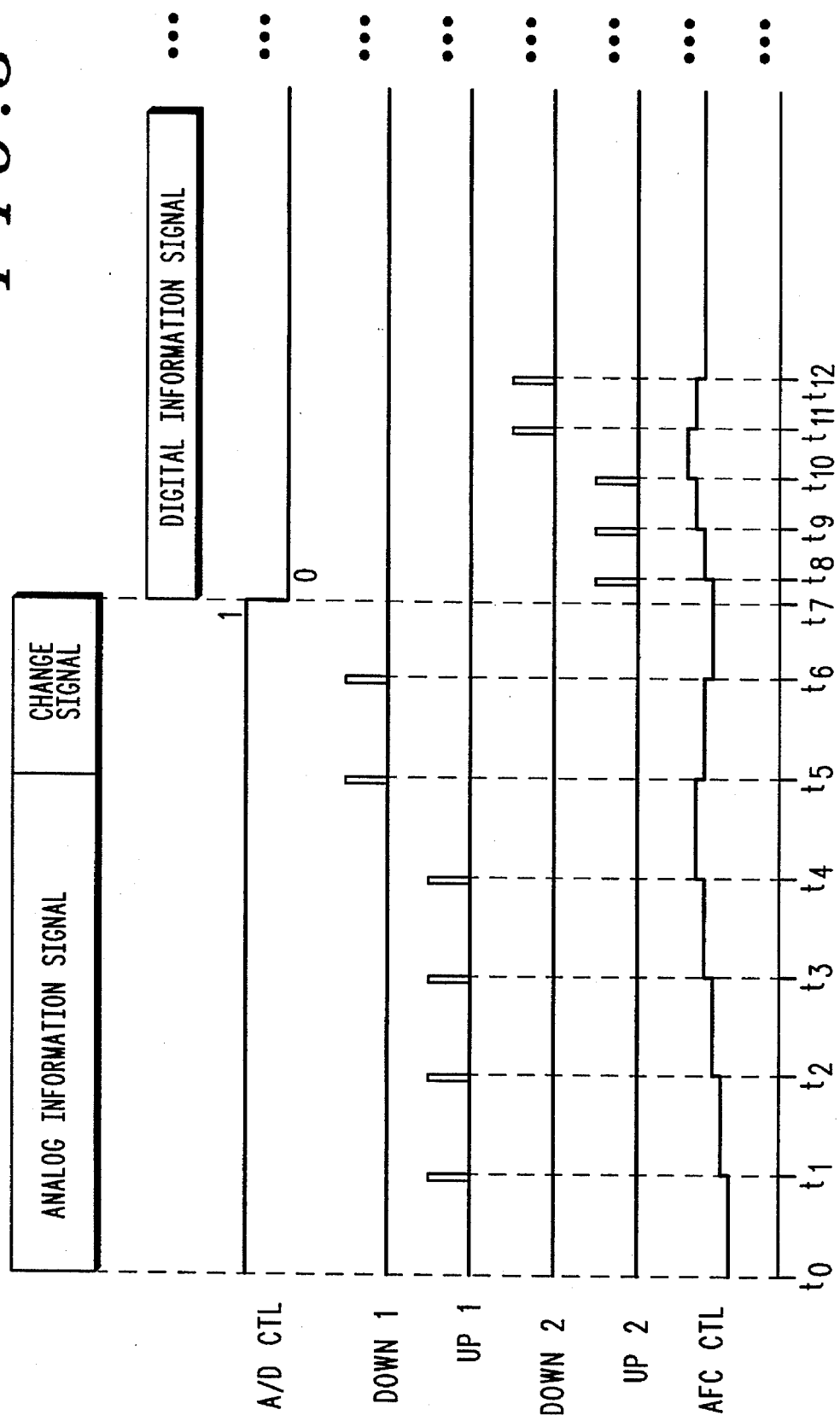

APPARATUS AND METHOD FOR AUTOMATICALLY CONTROLLING A REFERENCE FREQUENCY IN A DUAL MODE RECEIVER

This is a continuation of application Ser. No. 08/103,004, filed Aug. 6, 1993 and now abandoned.

FIELD OF THE INVENTION

The present invention relates generally to radio frequency communications and more particularly to an apparatus and method for automatically controlling a reference frequency in a receiver that receives either an analog information signal or a digital information signal.

BACKGROUND OF THE INVENTION

The basic operation and structure of radio frequency (RF) communication systems, such as cellular radio telephone systems communications systems and land mobile communication systems, are well known in the art. Communication systems typically comprise a plurality of communication units, a predetermined number of base stations (or repeaters) located throughout a geographic region and a controller. The communication units may be vehicle mounted or portable units and comprise either a transmitter or a receiver or both to form a transceiver. The communication unit is coupled to the base station by a communication channel over which RF signals are transmitted and/or received. The controller comprises a centralized call processing unit or a network of distributed controllers working together to establish communication paths for the communication units.

The RF signals typically comprise either analog or digital information signals modulated on a carrier signal at a carrier frequency. Communication units adapted to transmit and/or receive either the analog or digital information signals are characterized as being "dual mode". In a dual mode communication unit consideration is given to combining analog and digital implementations of a particular function performed by the dual mode communication unit to produce an efficient design. One such function performed by the receiver of a dual mode communication unit is automatic frequency control (AFC) of a reference frequency. In general, AFC of a reference frequency is well known in the art.

One problem with implementing AFC in a dual mode receiver is that the characteristics of the modulation require different methods of AFC. The signal received in analog mode, typically a narrow-band FM signal, has no average frequency shift relative to the carrier, the modulation having no DC component. Thus, a simple phase detector or frequency counter can be used to compare a measure of the received signal and a measure of the reference signal, to control the reference signal and tune the receiver and transmitter with respect to the received signal. The signal received in digital mode, conversely, can have an absolute frequency shift with respect to the carrier because the modulation (typically pi/4-shift QDPSK) introduces an arbitrary and possibly accumulating phase shift to the carrier. This requires that a means of removing the effect of the modulation on the digital-mode received signal be provided, to extract a measure of the true carrier for comparison with a measure of the reference signal.

Another problem with implementing AFC in a dual mode receiver is that the response time for digital mode AFC needs to be substantially faster than for analog mode. During a channel change in analog mode, if the two received signals have different carrier frequency offsets, the AFC must be readjusted for the new carrier offset. In analog mode the period of AFC error prior to the completion of the adjustment process results in a slightly degraded audio quality, which can be tolerated for some time; hence a simple AFC correction loop, of low cost and power consumption, is optimum. During a channel change in digital mode, if the relative carrier frequency shifts are significant, the channel may be lost producing a period of lost speech. It is desirable to avoid this; thus, a fast AFC response rate is required in digital mode.

Another problem with implementing AFC in a dual mode receiver is in the switching between the analog and digital modes. When switching from one mode to the other the ending state of the AFC control signal for one mode needs to be used as the beginning state of the AFC control signal for the other mode. With two different methods of generating the AFC control signal, some means needs to be provided for initializing the control signal based on the previous value, when a mode change occurs.

The prior art has addressed the above problems by means of two separate AFC control signal sources, each with a separate means for generating an analog voltage AFC control signal, and a switch which selects between the two. The problem of initializing the digital-mode AFC during the transition from analog to digital mode is addressed by means of an A/D converter which captures the analog voltage generated by the analog-mode AFC control elements, and uses the voltage measured to initialize the digital-mode AFC control elements. The transition from digital mode to analog mode is not addressed, a transient error is permitted which eventually is corrected by the normal action of the analog-mode AFC control elements.

One disadvantage of the prior art solution is that complexity is substantial. Two separate means for generating an analog voltage AFC control signal are needed, and an A/D convertor needs to be provided for the sole purpose of intializing the control voltage for the digital mode. In addition the digital-mode to analog-mode transient is not addressed. Accordingly, there is a need for an improved apparatus and method for automatically controlling a reference frequency in a receiver that receives either an analog information signal or a digital information signal.

BRIEF DESCRIPTION OF THE DRAWINGS

The present invention will be better understood when read with reference to the accompanying drawings in which:

FIG. 3 illustrates a timing diagram for signals in the intermediate frequency circuitry of FIG. 2 in accordance with the present invention.

DETAILED DESCRIPTION OF THE PREFERRED EMBODIMENTS

Generally, the foregoing need is substantially met by an apparatus and method for automatically controlling a reference frequency in a receiver that receives either an analog information signal or a digital information signal. The analog information signal or the digital information signal are modulated on a carrier signal at a carrier frequency subsequent to transmission thereof by a transmitter. The receiver includes a frequency translator for translating the carrier frequency to an intermediate frequency and maintaining the intermediate frequency at a desired value responsive to a reference frequency.

In accordance with one embodiment of the present invention, a first measure of frequency error is detected, by a phase detector, between the reference frequency and the intermediate frequency. A second measure of frequency error is determined, by a processor, between the reference frequency and the intermediate frequency. A current signal is produced, by a current device, responsive to the first measure of frequency error when the receiver receives the analog information signal and responsive to the second measure of frequency error when receiver receives the digital information signal. A frequency control signal is produced, by a capacitive device, responsive to the current signal to automatically control thereby the reference frequency when the receiver receives either the analog information signal or the digital information signal.

Further, the first measure of frequency error is alternatively selected, by a switch, when the receiver receives the analog information signal and the second measure of frequency error is alternatively selected, by the switch, when receiver receives the digital information signal.

Particularly, the first measure of frequency error and the second measure of frequency error each comprise a first signal for adjusting the reference frequency up in frequency and a second signal for adjusting the reference frequency down in frequency. The frequency control signal responds to the current signal at a first rate in time when the receiver receives the analog information signal and at a second rate in time when the receiver receives the digital information signal.

A discussion of automatic frequency control of a reference frequency in a dual mode receiver is provided in U.S. Pat. No. 5,163,159, invented by Rich et al., and assigned to the assignee of the present invention (herein incorporated by reference).

Figure 1:
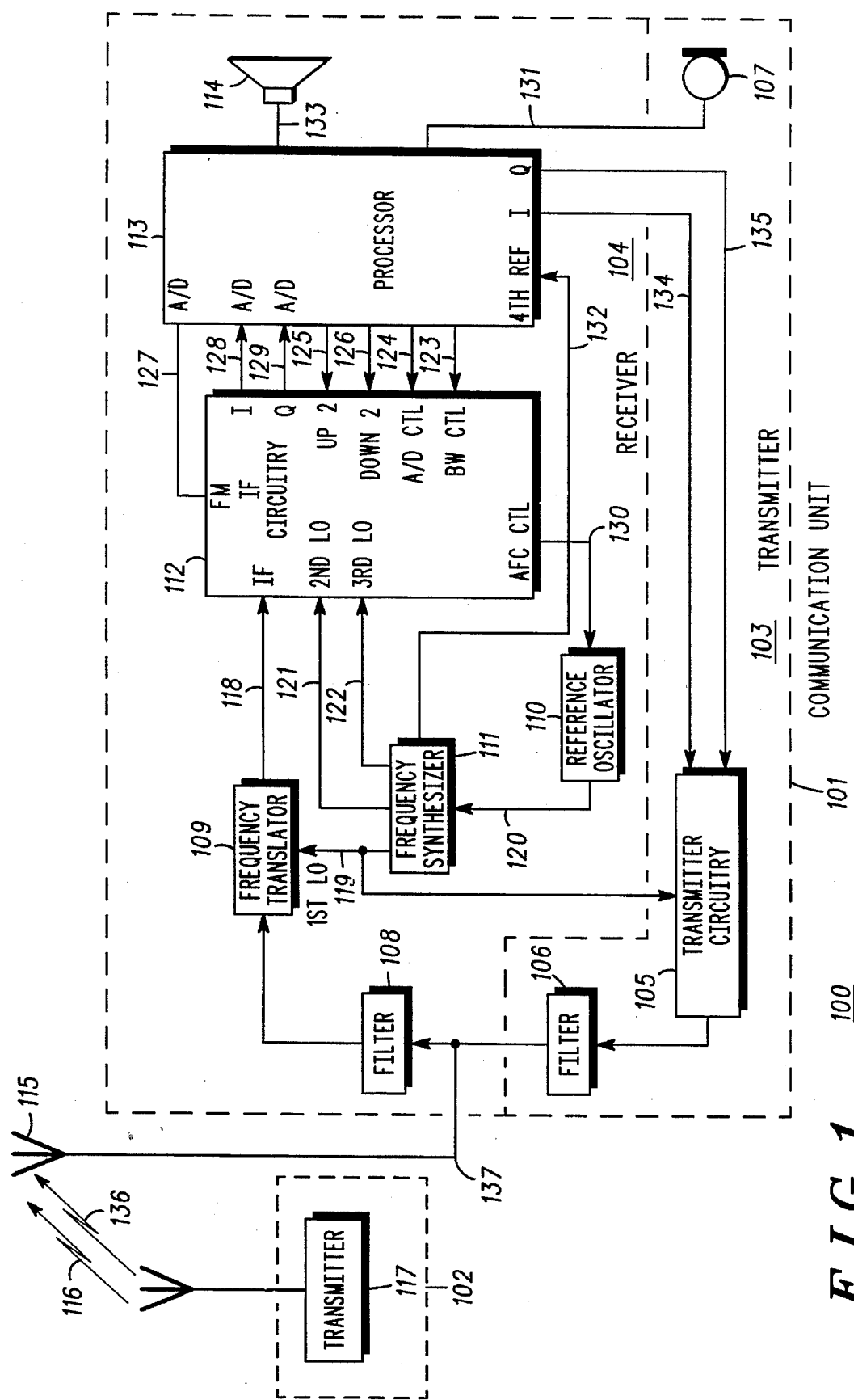
FIG. 1 illustrates a block diagram of a communication system including a base station and a communication unit including a receiver in accordance with the present invention.
Figure 2:
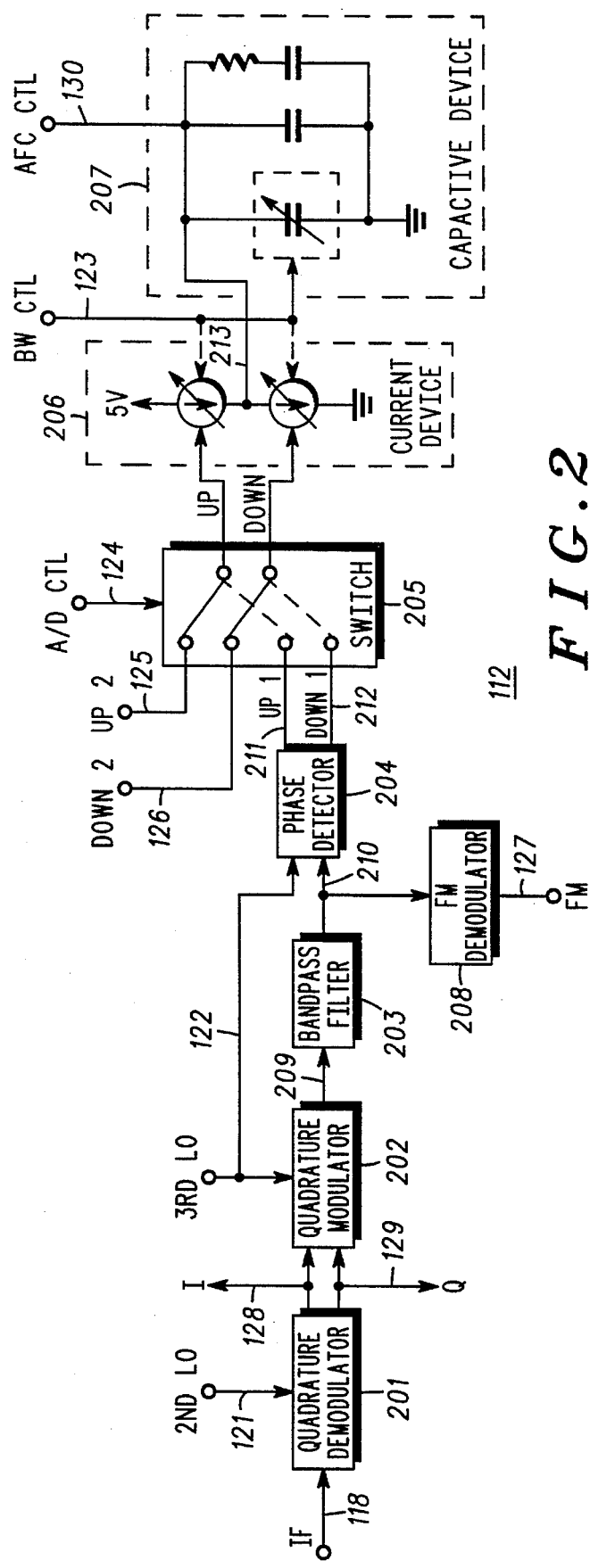
FIG. 2 illustrates a partial block diagram and partial schematic diagram of intermediate frequency circuitry of the receiver of FIG. 1 in accordance with the present invention.

The detailed description of the preferred embodiment of the present invention can be better understood when read with reference to the accompanying drawings illustrated in FIGS. 1–3.

FIG. 1 illustrates a block diagram of a communication system 100 including a base station 102 and a communication unit 101, wherein the communication unit 101 includes a dual mode receiver in accordance with the present invention. The communication unit 101 generally comprises a transmitter 103 and a receiver 104. The transmitter 103 generally comprises transmitter circuitry 105, a filter 106 and a microphone 107. The receiver 104 generally comprises a filter 108, a frequency translator 109, a reference oscillator 110, a frequency synthesizer 111, intermediate frequency (IF) circuitry 112, a processor 113, a speaker 114, and an antenna 115. Generally, the sharing of the antenna 115 and circuitry such as the processor 113 and the reference oscillator 110 between the transmitter 103 and the receiver 104 is well known in the art. Individually, the base station 102, the transmitter circuitry 105, the filter 106 and the microphone 107, the filter 108, the frequency translator 109, the reference oscillator 110, the frequency synthesizer 111, the speaker 114, and the antenna 115, are well known in the art, thus no further discussion will be presented except to facilitate the understanding of the present invention. The IF circuitry 112 will be discussed in detail below with reference to FIGS. 2 and 4 in accordance with the present invention. The processor 113 will be discussed in detail below with reference to FIGS. 3 and 4 in accordance with the present invention.

The receiver is capable of receiving, via the antenna 115, either an analog information signal 116 or a digital information signal 136 modulated on a carrier signal at a carrier frequency at line 137 subsequent to transmission thereof by a transmitter 117 in the base station 102. The frequency translator 109 translates the carrier frequency at line 137 to an intermediate frequency at line 118 and maintains the intermediate frequency at line 118 at a desired value responsive to a first representation of a reference frequency at line 119 via the frequency synthesizer 111.

The IF circuitry 112 is coupled to receive the intermediate frequency at line 118, a second representation of a reference frequency at line 121, a third representation of a reference frequency at line 122, an UP2 signal at line 125, a DOWN2 signal at line 126, an analog/digital control signal (A/D CTL) at line 124 and a bandwidth control signal (BW CTL) at line 123. The IF circuitry 112 is operative to produce a demodulated analog signal at line 127, a demodulated digital in-phase signal (I) at line 128 and a demodulated digital quadrature-phase signal (Q) at line 129, and an automatic frequency control signal (AFC CTL) at line 130.

The processor 113 is coupled to receive the demodulated analog signal at line 127, the demodulated digital signals I and Q at lines 128 and 129, respectively, a fourth representation of the reference signal at line 132 and an audio input signal at line 131. The processor 113 is operative to produce the UP2 signal at line 125, the DOWN2 signal at line 126, the A/D CTL signal at line 124, the BW CTL signal at line 123, a modulated digital in-phase signal I at line 134 and a modulated digital quadrature-phase signal Q at line 135 and an analog audio output signal at line 133. The processor 113 includes integrated analog to digital (A/D) converters, as shown, in order to receive analog signals for digital processing.

In the preferred embodiment of the present invention, the communication unit is a dual-mode FM/TDMA cellular radiotelephone designed to function in conjunction with the cellular telephone systems as specified by Electronic Industries Association (EIA) standards IS-54 and IS-19 as is well known in the art. Another embodiment would be a dual-mode FM/CDMA cellular radiotelephone designed to function in conjunction with the cellular telephone systems as specified by Electronic Industries Association (EIA) standards IS-19 and PN-3118 as is well known in the art.

In the preferred embodiment of the present invention, the analog information signals 116 are represented by narrow-band frequency modulation of a carrier wave. The voice portions of the information are modulated to 2.9 kHz deviation of the carrier for nominal voice level, for a 1 kHz tone. A supervisory audio tone is provided at a frequency near 6 kHz, which is modulated to a 2 kHz deviation level. In addition, signalling information is transmitted in bursts from time to time at a 10 kB/sec rate, in Manchester-encoded format, at 8 kHz deviation.

The digital information signals are represented by pi/4-shift DQPSK modulation of a carrier wave. The modulation method is taught by the text DIGITAL COMMUNICATIONS, John G. Proakis, 1983 edition (McGraw-Hill), page 171 and 172. An alternate embodiment of the digital information signals 136 would be a spread spectrum signal such as that taught by the same reference, in section 8.2.

In the preferred embodiment of the present invention, the frequency translator 109 is a frequency synthesizer, producing a signal at a frequency differing from the received signal by an amount equal to the first intermediate frequency (IF), as is known in the art. This signal is mixed with the received signal in a non-linear mixer device to produce a signal at the first IF, again as is known in the art.

In the preferred embodiment of the present invention, the processor 113 is a digital signal processor (DSP), similar to the Motorola DSP56156. An alternative DSP would be the Texas Instruments TMS320C50.

FIG. 2 illustrates a partial block diagram and partial schematic diagram of the IF circuitry 112 of the receiver 104 of FIG. 1 in accordance with the present invention. The IF circuitry 112 generally includes a quadrature demodulator 201, a quadrature modulator 202, a bandpass filter 203, a phase detector 204, a switch 205, a current device 206, a low pass filter 207 and a FM demodulator 208. Individually, all the elements in the IF circuitry 112 are well known in the art, thus no further discussion will be presented except to facilitate the understanding of the present invention.

The quadrature demodulator 201 is coupled to receive the IF frequency at line 118 and the second representation of the reference signal at line 121 and operable to produce the demodulated I and Q signals at lines 128 and 129, respectively. The quadrature modulator 202 is coupled to receive the demodulated I and Q signals at lines 128 and 129, respectively, and the third representation of the reference frequency at line 122 and operable to to reproduce the IF at line 209. The bandpass filter 203 is coupled to receive the IF at line 209 and operable to produce a filtered signal at line 210. The FM demodulator is coupled to receive the filtered signal at line 210 and operable to produce the FM signal at line 127.

In accordance with the present invention, the phase detector 204 is coupled to receive the reference frequency at line 122 and the intermediate frequency at line 210 and operative to determine a first measure of frequency error, UP1 and DOWN1, at lines 211 and 212, respectively, between the reference frequency at line 122 and the intermediate frequency at line 210, in response to said first measure of frequency error.

The processor 113 in FIG. 1 is coupled to receive the reference frequency at line 132 and the intermediate frequency, I and Q at lines 128 and 129, respectively, and operative to determine a second measure of frequency error, UP2 and DOWN2 at lines 125 and 126, respectively, between the reference frequency at line 132 and the intermediate frequency at lines 128 and 129.

The current device 206 is coupled to receive the first measure of frequency error UP1 and DOWN1 at lines 211 and 212, respectively, when the receiver 104 receives the analog information signal 116 and coupled to receive the second measure of frequency error UP2 and DOWN2 at lines 125 and 126, respectively, when receiver 104 receives the digital information signal 136, and operative to produce a current signal at line 213 responsive to either the first or the second measure of frequency error.

The capacitive device 207 is coupled to receive the current signal at line 213 and operative to produce a frequency control signal at line 130 responsive to the current signal at line 213 to automatically control thereby the reference frequency at line 120 in FIG. 1 when the receiver receives either the analog information signal or the digital information signal.

Additionally, the switch 205 is coupled to receive the first measure of frequency error, UP1 and DOWN1 at lines 211 and 212, respectively, and the second measure of frequency error, UP2 and DOWN2 at lines 125 and 126, respectively, and operable to alternatively select the first measure of frequency error, UP1 and DOWN1 at lines 211 and 212, respectively, when the receiver receives the analog information signal and the second measure of frequency error UP2 and DOWN2 at lines 125 and 126, respectively, when receiver receives the digital information signal. Further, according to the preferred embodiment of the present invention, the switch is actuated responsive to a signal transmitted by the transmitter.

According to the preferred embodiment of the present invention, the frequency control signal responds to the current signal at a first rate in time when the receiver receives the analog information signal 116 and at a second rate in time when the receiver receives the digital information signal 136.

According to the preferred embodiment of the present invention, the first measure of frequency error and the second measure of frequency error each comprise a first signal for adjusting the reference frequency up in frequency and a second signal for adjusting the reference frequency down in frequency.

In the preferred embodiment of the present invention, the phase detector generally compares two inputs of signal having similar frequencies and generates an output indicating the phase and or frequency difference between the two inputs.

In the preferred embodiment of the present invention, the switch 205 is a multiplexer, for example an analog multiplexor such as Motorola device type MC14053. An alternative implementation would be a logic function implementing the expressions:

UP=((A/D CTL .AND. UP1) .OR. ((.NOT.(A/D CTL)) .AND. UP2)))

DOWN=((A/D CTL .AND. DOWN1) .OR. ((.NOT.(A/D CTL)) .AND. DOWN2)))

In the preferred embodiment of the present invention, the current device is a combination of a controllable current source and a controllable current sink with a common connection for output. The source and sink could be implemented as controlled switched current mirrors with P-channel and N-channel transistors, respectively. The bandwidth control (BW CTL) signal would be used to adjust the value of the current being mirrored, as is commonly known in the art.

In the preferred embodiment of the present invention, the capacitive device is a low pass filter. The simplest filter would be a single capacitor. If it were desired to implement a higher order closed loop response the filter could be as shown in block 207 of FIG. 2, with two fixed capacitors and a resistor. The adjustable capacitor of FIG. 2 block 207 can also be used to adjust the response time of the low pass filter function.

In the preferred embodiment of the present invention, the BW CTL signal at line 123 is responsive to the type of signal being received, whether analog or digital. It can also be used to adjust the AFC response time to temporarily speed of AFC correction rate, for example when changing channels, or in response to channel conditions such as loss of received signal.

FIG. 3 illustrates a timing diagram for signals in the intermediate frequency circuitry 112 of FIG. 2 in accordance with the present invention. At time to the receiver receives the analog information signal 116 in the analog mode. The analog mode is indicated by a logic 1 of the A/C CTL signal at line 124. The AFC CTL signal at line 130 is adjusted up in voltage at times t1–t4 responsive to corresponding pulse signals generated by the UP1 signal at line 211. The AFC CTL signal at line 130 is adjusted down in voltage at times t5–t6 responsive to corresponding pulse signals generated by the DOWN1 signal at line 212. In the analog mode signals, UP2 and DOWN2 signals at lines 125 and 126, respectively, are not used for AFC.

At time t7, the radio 101 receives a change signal from the base station's transmitter 117 prompting the radio 101 to change to the digital mode. The digital mode is indicated by a logic 0 of the A/C CTL signal at line 124. The AFC CTL signal at line 130 is adjusted up in voltage at times t8–t10 responsive to corresponding pulse signals generated by the UP2 signal at line 125. The AFC CTL signal at line 130 is adjusted down in voltage at times t11–t12 responsive to corresponding pulse signals generated by the DOWN2 signal at line 126. In the digital mode signals UP1 and DOWN1 at lines 211 and 212, respectively, are not used for AFC.

Thus, it is apparent that there is provided an improved apparatus and method for automatically controlling the reference frequency in the receiver that receives either the analog information signal or the digital information signal which fully meets the needs set forth above. In accordance with the present invention, the first measure of frequency error is detected, by the phase detector, between the reference frequency and the first representation of the intermediate frequency. The second measure of frequency error is determined, by the processor, between the reference frequency and the intermediate frequency. The current signal is produced, by the current device, responsive to the first measure of frequency error when the receiver receives the analog information signal and responsive to the second measure of frequency error when receiver receives the digital information signal. The frequency control signal is produced, by the capacitive device, responsive to the current signal to automatically control thereby the reference frequency when the receiver receives either the analog information signal or the digital information signal.

With the present invention the problems of complexity and transient response and differing response rate needs of the prior art are substantially resolved. The present invention advantageously provides a single charge-steering device and a capacitive device, in combination with a multiplexor, to implement a means of combining the digital and analog AFC element outputs in a manner which results in the least complexity of circuit elements, and resolves the transient and response-rate adjustment issues on mode change.

While the present invention has been described with reference to illustrative embodiments thereof, it is not intended that the invention be limited to these specific embodiments. Those skilled in the art will recognize that variations and modifications can be made without departing from the spirit and scope of the invention as set forth in the appended claims.

What is claimed is:

1. In a receiver for receiving either an analog information signal or a digital information signal modulated on a carrier signal at a carrier frequency subsequent to transmission thereof by a transmitter, wherein the receiver includes a frequency translator for translating the carrier frequency to an intermediate frequency and maintaining the intermediate frequency at a desired value responsive to a reference frequency, an apparatus for automatically controlling the reference frequency when the receiver receives either the analog information signal or the digital information signal, comprising:

a phase detector coupled to receive the reference frequency and the intermediate frequency and operative to detect a first measure of frequency error between the reference frequency and the intermediate frequency;

a processor coupled to receive the reference frequency and the intermediate frequency and operative to determine a second measure of frequency error between the reference frequency and the intermediate frequency;

a current device coupled to receive the first measure of frequency error when the receiver receives the analog information signal and coupled to receive the second measure of frequency error when receiver receives the digital information signal, and operative to produce a current signal responsive to either the first or the second measure of frequency error; and a capacitive device coupled to receive the current signal and operative to produce a frequency control signal responsive to the current signal to automatically control thereby the reference frequency when the receiver receives either the analog information signal or the digital information signal.

2. An apparatus according to claim 1 further comprising a switch, operatively coupled to the current device, coupled to receive the first measure of frequency error and the second measure of frequency error and operable to alternatively select the first measure of frequency error when the receiver receives the analog information signal and the second measure of frequency error when receiver receives the digital information signal.

3. An apparatus according to claim 2 wherein the switch is actuated responsive to either the analog information signal or the digital information signal.

4. An apparatus according to claim 2 wherein the switch comprises a multiplexer.

5. An apparatus according to claim 1 wherein the first measure of frequency error and the second measure of frequency error each comprises a first signal for adjusting the reference frequency up in frequency and a second signal for adjusting the reference frequency down in frequency.

6. An apparatus according to claim 1 wherein the frequency control signal responds to the current signal at a first rate in time when the receiver receives the analog information signal and at a second rate in time when the receiver receives the digital information signal.

7. In a receiver for receiving either an analog information signal or a digital information signal modulated on a carrier signal at a carrier frequency subsequent to transmission thereof by a transmitter, wherein the receiver includes a frequency translator for translating the carrier frequency to an intermediate frequency and maintaining the intermediate frequency at a desired value responsive to a reference frequency, a method for automatically controlling the reference frequency when the receiver receives either the analog information signal or the digital information signal, comprising the steps of:

detecting a first measure of frequency error between the reference frequency and the intermediate frequency when the receiver receives the analog information signal;

determining a second measure of frequency error between the reference frequency and the intermediate frequency when receiver receives the digital information signal;

producing a current signal, wherein the current signal is responsive to the first measure of frequency error when the receiver receives the analog information signal, and wherein the current signal is further responsive to the second measure of frequency error when receiver receives the digital information signal; and producing a frequency control signal responsive to the current signal to automatically control thereby the reference frequency when the receiver receives either the analog information signal or the digital information signal.

8. A method according to claim 7 further comprising the step of alternatively selecting the first measure of frequency error when the receiver receives the analog information signal and the second measure of frequency error when receiver receives the digital information signal.

9. A method according to claim 8 wherein the step of alternatively selecting is determined responsive to either the analog information signal or the digital information signal.

10. A method according to claim 8 wherein the step of alternatively selecting further comprises the step of multiplexing the first measure of frequency error when the receiver receives the analog information signal and the second measure of frequency error when receiver receives the digital information signal.

11. A method according to claim 7 wherein the first measure of frequency error and the second measure of frequency error each comprises a first signal for adjusting the reference frequency up in frequency and a second signal for adjusting the reference frequency down in frequency.

12. A method according to claim 7 wherein the frequency control signal responds to the current signal at a first rate in time when the receiver receives the analog information signal and at a second rate in time when the receiver receives the digital information signal.

13. A communication unit comprising:
a receiver for receiving either an analog information signal or a digital information signal modulated on a carrier signal at a carrier frequency subsequent to transmission thereof by a transmitter, the receiver including:
a frequency translator for translating the carrier frequency to an intermediate frequency and maintaining the intermediate frequency at a desired value responsive to a reference frequency;
a phase detector coupled to receive the reference frequency and the intermediate frequency and operative to detect a first measure of frequency error between the reference frequency and the intermediate frequency;
a processor coupled to receive the reference frequency and the intermediate frequency and operative to determine a second measure of frequency error between the reference frequency and the intermediate frequency;
a current device coupled to receive the first measure of frequency error when the receiver receives the analog information signal and coupled to receive the second measure of frequency error when receiver receives the digital information signal, and operative to produce a current signal responsive to either the first or the second measure of frequency error; and
a capacitive device coupled to receive the current signal and operative to produce a frequency control signal responsive to the current signal to automatically control thereby the reference frequency when the receiver receives either the analog information signal or the digital information signal.

14. A method of operating a communication unit comprising the step of:
receiving either an analog information signal or a digital information signal modulated on a carrier signal at a carrier frequency subsequent to transmission thereof by a transmitter, the step of receiving further including the steps of:
translating the carrier frequency to an intermediate frequency and maintaining the intermediate frequency at a desired value responsive to a reference frequency;
detecting a first measure of frequency error between the reference frequency and the intermediate frequency when the receiver receives the analog information signal;
determining a second measure of frequency error between the reference frequency and the intermediate frequency when receiver receives the digital information signal;
producing a current signal, wherein the current signal is responsive to the first measure of frequency error when the receiver receives the analog information signal, and wherein the current signal is further responsive to the second measure of frequency error when receiver receives the digital information signal; and
producing a frequency control signal responsive to the current signal to automatically control thereby the reference frequency when the receiver receives either the analog information signal or the digital information signal.

* * * * *